United States Patent [19]

Rheinfelder

[11] 3,973,214
[45] Aug. 3, 1976

[54] CIRCUIT TO ACHIEVE LOW NOISE FIGURE
[75] Inventor: William A. Rheinfelder, Phoenix, Ariz.
[73] Assignee: Alpha Engineering Corporation, Phoenix, Ariz.
[22] Filed: Jan. 20, 1975
[21] Appl. No.: 542,191

[52] U.S. Cl. .................................. 330/31; 330/21
[51] Int. Cl.² ........................................ H03F 3/04
[58] Field of Search .............................. 330/21, 31

[56] References Cited
UNITED STATES PATENTS
3,160,824  12/1964  Stair .................................. 330/31 X
3,581,122  5/1971  Gaunt, Jr. ......................... 330/31 X Primary Examiner—R. V. Rolinec
Assistant Examiner—Lawrence J. Dahl
Attorney, Agent, or Firm—Cahill, Sutton & Thomas

[57] ABSTRACT

A circuit comprising the first stage of a multi-stage amplifier is described, incorporating a plurality of networks connected between the input stage transistor emitter and ground. The networks are connected in parallel; each comprises a series resonant circuit, the resonant frequencies and component values of which have been chosen to provide wideband impedance-matching to the base of the transistor while achieving a low noise figure.

12 Claims, 6 Drawing Figures

CIRCUIT TO ACHIEVE LOW NOISE FIGURE

The present invention pertains to amplifier circuits and more particularly to the input stage of a broadband, solid-state, multi-stage amplifier useful in high frequency applications such as in CATV systems (in the frequency range of 20 MHz to 300 MHz).

In cable television systems, the signal being transmitted along the cable is attenuated as a function of the distance travelled; the attenuation is, however, not linear with respect to the frequency range. That is, the low frequencies in the television signal spectrum (e.g., Channel 2) are attenuated less than the higher frequencies in the spectrum (e.g., Channel 13). It is therefore customary to provide amplifiers at predetermined spacing along the cable for amplification of the signals, which amplifiers have a frequency-gain characteristic that compensates for this unequal attenuation. Some prior art amplifiers achieve a portion of the desired frequency-gain characteristic by utilizing a compensating feedback impedance in the emitter circuit of the input stage transistor with the remainder of the required equalization achieved elsewhere in the amplifier circuit. Internal emitter impedance, together with external frequency-compensating networks result in input impedance variations that are frequency-dependent and are unacceptable. It is imperative that the impedance match at the input stage of each amplifier be as nearly ideal as possible to minimize the deleterious effects of excessive voltage standing wave ratios (VSWR). In prior amplifiers, to provide the required impedance-matching over the CATV frequency spectrum, impedance networks are connected between the cable and the base of the input stage transistor.

While the above technique generally accomplishes impedance match, the impedances cause a substantial loss in signal power while the noise remains unchanged. The noise figure of this typical circuit is therefore very poor.

It is therefore an object of the present invention to provide a broadband solid-state amplifier, including an input stage having a correct input impedance over a broadband frequency range while providing a low noise figure.

It is also an object of the present invention to provide an input stage to a multi-stage, broadband, solid-state amplifier incorporating a plurality of series resonant networks in the emitter circuit of the first stage transistor having resonant frequencies distributed over the frequency range of the system.

It is still another object of the present invention to provide a CATV amplifier input stage that is properly impedance-matched over the frequency range without power-absorbing impedance networks in the base of the input stage transistor.

These and other objects of the present invention will become apparent to those skilled in the art as the description proceeds.

The present invention may be more readily described by reference to the accompanying drawings in which.

One of the parameters of critical importance to the present invention is the noise figure of the circuit. A variety of sources of noise are present in the circuits of the type described herein, including thermal noise, shot noise, etc. The theoretical minimum possible noise level, that is, noise generated by thermal effects only, can be calculated. For example, at the typical CATV cable resistance of 75 ohms at a bandwidth of 4MHz, the theoretical minimum noise voltage is 2.21 microvolts rms at 75° F. This minimum noise value coupled with other noise-producing sources affect the signal-to-noise ratio of any amplifier. The noise factor of an amplifier may be stated to be the signal-to-noise degradation as the signal passes through the amplifier. For example, if a signal is applied to the input of an amplifier, which signal has a signal-to-noise ratio of 80 db and the signal available at the output of the amplifier has a signal-to-noise ratio of 70 db, the signal-to-noise degradation in the amplifier is then 10 db; stated differently, the amplifier has a noise figure of 10 db.

The noise figure of an amplifier is its noise factor expressed in db. For example, a circuit producing twice as much noise power as is ideally possible has a noise factor of 2, or, a noise figure of 3 db. The noise factor may be directly calculated from the ratio of input signal-to-noise ratio to output signal-to-noise ratio. Therefore, wherever signal loss occurs with the noise unchanged, the noise factor and figure change. For instance, the addition of a network to the input of the amplifier (such as for impedance-matching as described above, or for correction of cable loss-frequency characteristics), will result in a signal loss (in prior art practice, typically 6 to 12 db). The loss resulting from the addition of the network therefore increases the noise figure by the same amount. Typical present first stage amplifier noise figures range from 13 db to 15 db while the best theoretical noise figure under matched conditions is 3 db. It has been found that by using the system of the present invention noise figures in the range of 4 db to 5 db are possible.

Figure 1:
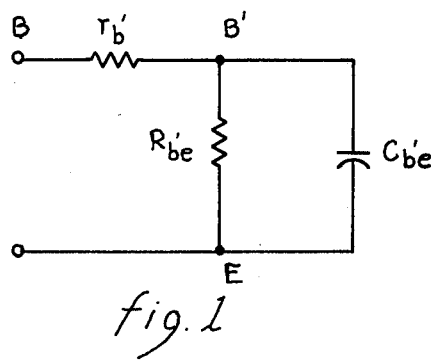
FIG. 1 is a conventional input equivalent circuit of a transistor.
Figure 2:
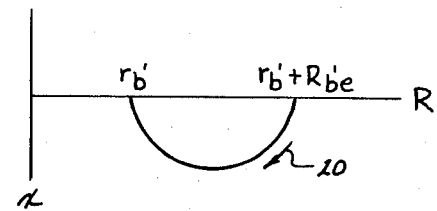
FIG. 2 is an input impedance diagram in the RX plane.

Referring now to FIG. 1, a conventional equivalent circuit for a transistor is shown wherein resistance $r_b{'}$ is shown connected between the external base B and internal base B'. A resistor $R_{b',e}$ is connected between the internal base B' and the emitter E in parallel with shunt capacitance $C_{b',e}$. The input impedance of the equivalent circuit of FIG. 1 may be plotted in the RX plane as shown in FIG. 2. The curve representing the impedance in FIG. 2 is for frequencies increasing in the direction indicated by Arrow 10. An inspection of FIG. 2 reveals that at low frequencies the impedance is resistive and equal to the sum of $r_b{'}$ and $R_{b',e}$. At high frequencies, the impedance is again resistive and equal to $r_b{'}$.

Figure 3:
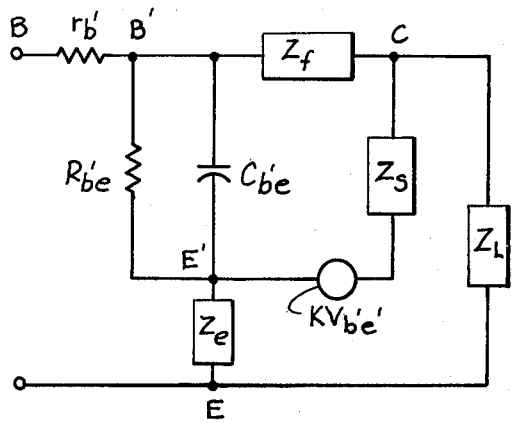
FIG. 3 is a transistor equivalent circuit diagram as described herein.

In certain applications of amplifier technology, such as in CATV applications, the parameters of the input stage transistor become critical to proper amplifier design. It has been found that the equivalent circuit of FIG. 1 and the plot of the impedance shown in FIG. 2 are not entirely correct or sufficiently precise for such critical applications. FIG. 3 shows a more correct equivalent circuit of an actual transistor. Referring now to FIG. 3, an internal emitter impedance $Z_e$ is shown between the intrinsic emitter E' and the external emitter E. An internal generator $KV_{b'e'}$ amplifies the signal between the internal base B' and emitter E' with an equivalent generator impedance $Z_s$. Feedback impedance $Z_f$ is connected between the collector C and base B'. The external load impedance $Z_L$ is provided between collector C and emitter E. In this circuit, series current feed back through $Z_e$ and shunt voltage feed back through $Z_f$ are effected simultaneously.

Figure 4:
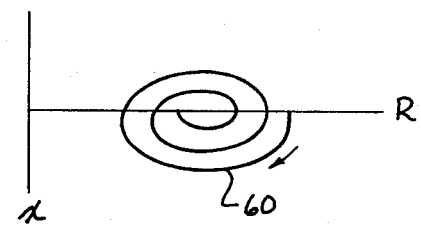
FIG. 4 is an input impedance diagram in the RX plane describing the behavior of the circuit of FIG. 3.

A plot of the impedance of the equivalent circuit of FIG. 3 is shown in FIG. 4. It may be seen by an inspection of FIG. 4 that the impedance is not a single semicircle as in FIG. 2 but is a rather complicated, flattened spiral which is resistive at a plurality of frequencies.

Figure 5:
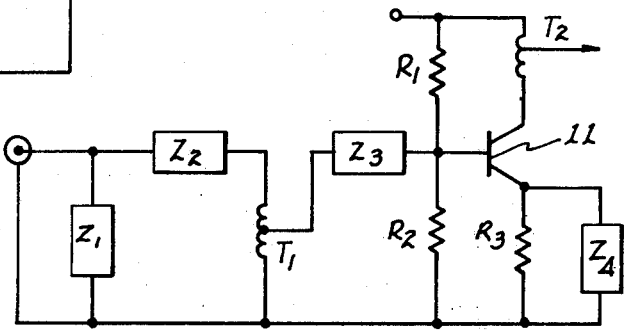
FIG. 5 is a schematic circuit diagram of the input stage of a typical prior art CATV amplifier.

Prior art input stages to CATV amplifiers were predicated upon the transistor equivalent circuit of FIG. 1 and the impedance curve of FIG. 2. A typical prior art input stage is schematically shown in FIG. 5. To closely match the input impedance of the coaxial cable to which the input stage is connected and to allow the frequency-gain characteristic to compensate for cable losses, an impedance such as the impedance $Z_4$ was placed in the emitter circuit of the transistor 11. This impedance altered the negative feedback produced by $R_3$ at predetermined frequencies; thus, an increase in gain was achieved at certain frequencies to compensate for the variation in signal attenuation over the frequency spectrum of the CATV signals (20MHz to 300 MHz). The inclusion of the impedance $Z_4$ results in a substantial frequency-dependent variation in the input impedance to the base of the transistor 11. The mismatch resulted in totally unacceptable VSWRs. To compensate for the impedance mismatch, an input impedance network schematically illustrated in FIG. 5 as impedances $Z_1$, $Z_2$ and $Z_3$ was added. Unfortunately, the addition of these impedances resulted in a substantial loss in signal power while the noise remained unchanged. The resulting noise figure of the circuit of FIG. 5 is therefore relatively poor, and is typically 13 db to 15 db.

Figure 6:
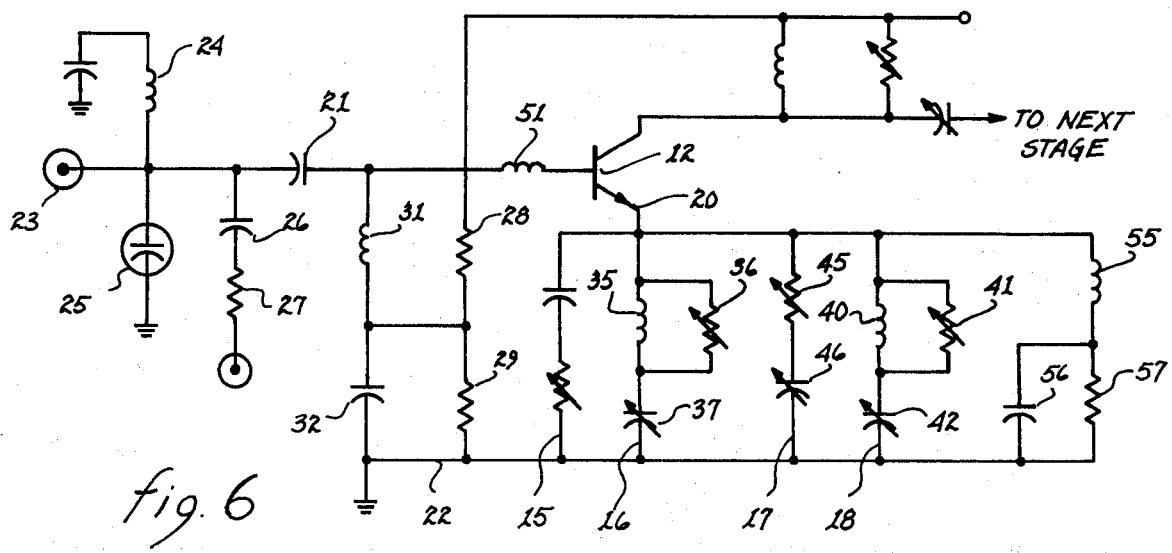
FIG. 6 is a schematic circuit diagram of the input stage of a CATV amplifier constructed in accordance with the teachings of the present invention.

The circuit of the present invention is based upon the equivalent circuit of FIG. 3 and its impedance curve of FIG. 4. Referring now to FIG. 6, an input stage constructed in accordance with the teachings of the present invention is shown. The input transistor 12 is provided with a plurality of networks 15, 16, 17 and 18 connected in parallel with each other between the emitter terminal 20 and a common ground 22. Each of these networks comprises a series resonant circuit incorporating the internal emitter impedance of the transistor as a part thereof. The input signal is applied through a coaxial cable connector 23 to the base of the transistor 12. An RFC choke 24 for powering purposes, a surge protector 25, test point components 26 and 27, and coupling capacitor 21 have an insignificant effect in this low noise design. Resistors 28 and 29 operate a base divider network, the noise from which is decoupled by RF choke 31 and a bypass capacitor 32. In low noise designs, such as the circuit of the present invention, the low frequency noise of the resistors may be troublesome and the bypass capacitor 32 becomes important (unlike a circuit having a noise figure of 13 db). Further, the bypass capacitor 32 serves the purpose of eliminating a loss component appearing across the choke 31 which would otherwise act as a noise generator.

The networks 15 through 18 produce a 75 ohm input impedance over the frequency range from 1 to 300 MHz. The individual networks are each adjusted to provide series resonance in that network having a resonant frequency chosen with respect to the resonant frequencies of the other networks to provide an input impedance to the stage of a predetermined nominal value. For example, the network 15 may typically incorporate a 5,000 pF capacitor in series with a 50 ohm miniature potentiometer, together with internal emitter inductance and external lead inductance. This network provides an input impedance match at the very low end of the frequency range. This corresponds to flattening the spiral in FIG. 4 and in particular, to decreasing the first negative going loop 60. The value of the capacitor may have to be changed somewhat, since the transistors furnished by the different manufacturers will include different internal inductances; however, with a capacitor as large as 5,000 pF, the internal inductance usually found in suitable transistors (50 nH) provides excellent low-end matching. The network 16 may typically include a seven-turn coil 35, one-quarter inch in diameter, in parallel with a 100 ohm potentiometer 36, both in series with a 150 pF trimmer capacitor 37. The network 16 may be termed the lower middle frequency network and provides an impedance match at the input to the stage in the lower middle frequencies of the frequency range. The upper middle frequency network 18 may be a three-turn coil 40, one-quarter inch in diameter, and parallel with a 500 ohm potentiometer 41, both in series with a 60 pF trimmer capacitor 42. The high frequency network 17 includes a 500 ohm potentiometer 45 in series with a 60 pF trimmer capacitor 46. RF choke 55, together with resistor 57 and capacitor 56 allow DC-current to flow to the emitter. Capacitor 56 prevents a noise-producing loss component from appearing across choke 55.

With the above networks 15 through 18 in combination with a typical transistor such as an S 3006, the circuit in FIG. 6 provides an input impedance match with a VSWR of 1.15 or less over the frequency range. To achieve a similar VSWR with a prior art circuit such as FIG. 5, the noise figure would have to be in the range of 13 db to 15 db. The circuit of FIG. 6 readily provides a noise figure in the range of 4 db to 5 db. Optionally, inductor 51 may be included to form a Pi network to provide high frequency peaking at the very top end of the frequency spectrum. Inductor 51 is typically three turns on a one-eighth inch diameter but may be formed simply by the lead inductance of the conductive path between connector 23 and the base of transistor 12. It may be noted that all of the coils are air-wound. The inclusion of inductor 51 actually increases the signal into the base of the transistor and further improves the noise figure at the high frequency end.

With the input stage as shown in FIG. 6, the input match is VSWR 1.15 or better and the noise figure, as stated above, is 4 db to 5 db (actually, the noise figure here has been found to be approximately 3.5 db to 4 db at Channel 2 and 4 db to 5 db at Channel 13). The overall equalization to achieve the required frequency-gain characteristics of the amplifier must now be accomplished either in the inter-stage network and/or the output stage since the first stage is designed solely for impedance match and low noise figure without concern for frequency-gain characteristics. The output of the first stage is applied through inter-stage networks to the succeeding stage which may also incorporate equalization networks; in the event such networks are to be used, it is likely that less than four such networks would be required. Further, in many applications less than four networks would be needed for the first stage. In the circuit of FIG. 6, the networks 15 through 18 have been shown with trimmer capacitors or potentiometers; it is not necessary to provide such full adjustability in production although it may be desirable to incorporate some "trimming" components to provide a modicum of adjustment.

With the low noise figure available by the circuit of the present invention, a better picture quality is achieved in a given system application and even field maintenance of the system is reduced since after a period of time in the field, degradation of the signal can be tolerated to a much greater degree than with prior art circuits. Such degradation may be caused by seasonal temperature changes, cable aging, misadjustments, etc. Nevertheless, with any given CATV system, the circuit of the present invention provides a greatly improved noise figure, thus permitting greater degradation effects without impairing picture quality and also allowing greater system length for a given picture quality. The circuit is also quite generally useful in all broadband, solid-state microwave amplifiers and is applicable to integrated circuits.

In other high frequency applications, such as microwave applications, high VSWR can be tolerated. In those instances, compensating networks such as those shown in FIG. 6 at 15, 16, 17 and 18 may be adjusted to provide a minimum noise figure over the frequency range of the particular application. In the embodiment chosen for illustration, the compensating networks have been designed to provide optimum impedance-matching and will inherently provide a low noise figure; however, the noise figure may be reduced even further if an increase in the VSWR can be tolerated.

I claim:
1. In a broadband solid-state amplifier for amplifying high frequency signals over a range of frequencies, an improved first amplifier stage comprising:
   a. a transistor having a base for receiving said high frequency signals, said base having an input impedance, said transistor also having a collector and an emitter, said emitter having an intrinsic frequency-dependent impedance;
   b. means coupling said high frequency signals to said base;
   c. a plurality of passive compensating circuits each connected between said emitter and a common ground and each forming, with said intrinsic emitter impedance, a series resonant circuit having an inductance, capacitance and resistance; said compensating circuits connected in parallel with each other, each having a different resonant frequency, the resonant frequency of each resonant circuit being evenly spaced over said range of frequencies;
   d. whereby said input impedance is substantially flat over a predetermined portion of said frequency range and whereby a minimum noise figure is established for said first amplifier stage.

2. The combination set forth in claim 1 wherein each of said compensating circuits comprises an external capacitor and an external resistor which form a series resonant circuit with the intrinsic impedance of said transistor emitter.

3. The combination set forth in claim 2 wherein at least one of said compensating circuits includes an external inductance.

4. The combination set forth in claim 1 wherein each of said predetermined portions of said frequency range overlaps at least one other predetermined portion of said frequency range.

5. The combination set forth in claim 1, including an inductance added to said base to provide improved input impedance match at the high frequency end of the frequency range of said high frequency signals.

6. The combination set forth in claim 1 including a base divider network comprising a pair of series connected resistors, one end of one said resistor connected to the ground, the junction between said resistors connected to the junction between a bypass capacitor and an RF choke connected to form a series circuit, said series circuit connected between said base and ground to decouple noise from said base divider network.

7. The combination set forth in claim 1 including an RF choke having one side connected to said emitter and the other side connected through a resistor to ground; a capacitor connected in parallel to said resistor; said choke resistor and capacitor providing DC-current to said emitter and preventing a noise-producing loss component from appearing across said choke.

8. The combination set forth in claim 1 including an inductance added to said base to provide improved noise figure at the high frequency end of said frequency range.

9. In a broadband CATV amplifier for amplifying signals in the frequency range of cable television, said amplifier having a predetermined frequency-gain characteristic for providing greater gain to higher frequencies in said frequency range than lower frequencies in said range, an improved first amplifier stage comprising:
   a. a transistor having a base for receiving said CATV signals, said base having an input impedance, said transistor also having a collector and an emitter, said emitter having an intrinsic frequency-dependent impedance;
   b. means coupling said CATV signals to said base;
   c. a plurality of passive compensating circuits each connected between said emitter and a common ground and each forming, with said intrinsic emitter impedance, a series resonant circuit having an inductance, capacitance and resistance; said compensating circuits connected in parallel with each other, each having a different resonant frequency, the resonant frequency of each resonant circuit being evenly spaced over said range of frequencies;
   d. whereby said input impedance is substantially flat over a predetermined portion of said frequency range and whereby a minimum noise figure is established for said first amplifier stage.

10. The combination set forth in claim 9 wherein each of said compensating circuits comprises an external capacitor and an external resistor which form a series resonant circuit with the intrinsic impedance of said transistor emitter.

11. The combination set forth in claim 10 wherein at least one of said compensating circuits includes an external inductance.

12. The combination set forth in claim 9 wherein each of said predetermined portions of said frequency range overlaps at least one other predetermined portion of said frequency range.

* * * * *